United States Patent
Han et al.

(10) Patent No.: US 9,859,108 B2
(45) Date of Patent: Jan. 2, 2018

(54) SUBSTRATE REGENERATION METHOD AND REGENERATED SUBSTRATE

(71) Applicant: Seoul Viosys Co., Ltd., Ansan-si (KR)

(72) Inventors: Chang Suk Han, Ansan-si (KR); Hwa Mok Kim, Ansan-si (KR); Mi So Ko, Ansan-si (KR); A Ram Cha Lee, Ansan-si (KR); Daewoong Suh, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/958,793

(22) Filed: Dec. 3, 2015

(65) Prior Publication Data
US 2016/0155628 A1    Jun. 2, 2016

Related U.S. Application Data

(63) Continuation of application No. PCT/KR2014/004717, filed on May 27, 2014.

(30) Foreign Application Priority Data

Jun. 3, 2013  (KR) .................. 10-2013-0063578

(51) Int. Cl.
*H01L 29/20* (2006.01)
*H01L 21/02* (2006.01)
(Continued)

(52) U.S. Cl.
CPC .... *H01L 21/02032* (2013.01); *H01L 21/0265* (2013.01); *H01L 29/2003* (2013.01);
(Continued)

(58) Field of Classification Search
CPC .......... H01L 21/02032; H01L 29/2003; H01L 29/34
(Continued)

(56) References Cited

U.S. PATENT DOCUMENTS

| 5,753,038 A | 5/1998 | Vichr et al. |
| 7,052,979 B2 * | 5/2006 | Nagai ..................... C30B 25/02 257/E21.119 |

(Continued)

FOREIGN PATENT DOCUMENTS

| JP | 2001-168042 A | 6/2001 |
| JP | 2006-237074 A | 9/2006 |

(Continued)

OTHER PUBLICATIONS

Korean Intellectual Property Office, International Search Report, International Application No. PCT/KR2014/004717, dated Aug. 27, 2014, 2 pages.

*Primary Examiner* — Vu A Vu
(74) *Attorney, Agent, or Firm* — Perkins Coie LLP

(57) ABSTRACT

Disclosed are a substrate regeneration method and a regenerated substrate. The substrate regeneration method comprises preparing a substrate having a surface separated from an epitaxial layer. The separated surface includes a convex portion and a concave portion, and the convex portion is comparatively flatter than the concave portion. A crystalline restoration layer is grown on the separated surface. The crystalline restoration layer is grown on the convex portion. Furthermore, a surface roughness improvement layer is grown on the crystalline restoration layer, thereby providing a continuous surface. Accordingly, it is possible to provide a regenerated substrate, which has a flat surface, without using physical polishing or chemical etching technology.

20 Claims, 7 Drawing Sheets

(51) Int. Cl.
*H01L 29/34* (2006.01)
*H01L 33/12* (2010.01)
*H01L 33/00* (2010.01)

(52) U.S. Cl.
CPC .......... *H01L 29/34* (2013.01); *H01L 33/0075* (2013.01); *H01L 33/12* (2013.01)

(58) Field of Classification Search
USPC ........................................................ 257/615
See application file for complete search history.

(56) References Cited

U.S. PATENT DOCUMENTS

| | | | | |
|---|---|---|---|---|
| 8,008,170 | B2* | 8/2011 | Liang | ................. H01L 21/0242 |
| | | | | 257/64 |
| 8,158,971 | B2* | 4/2012 | Choi | ..................... B82Y 10/00 |
| | | | | 257/40 |
| 8,435,879 | B2* | 5/2013 | Hanser | .................... C30B 25/02 |
| | | | | 257/E21.097 |
| 2005/0186764 | A1 | 8/2005 | Wu et al. | |
| 2011/0069729 | A1* | 3/2011 | Strittmatter | ............ B82Y 20/00 |
| | | | | 372/45.01 |
| 2013/0228809 | A1* | 9/2013 | Chang | ................ H01L 33/0079 |
| | | | | 257/98 |

FOREIGN PATENT DOCUMENTS

| | | |
|---|---|---|
| JP | 2008-110895 A | 5/2008 |
| KR | 10-2013-0041620 A | 4/2013 |

\* cited by examiner

[Figure 6]
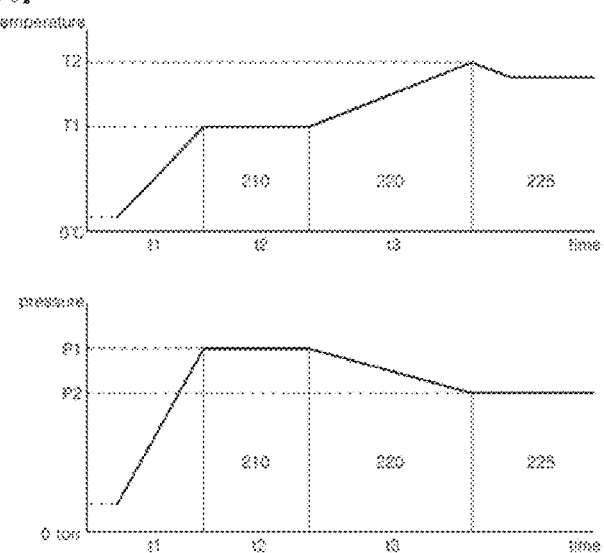
[Figure 7]
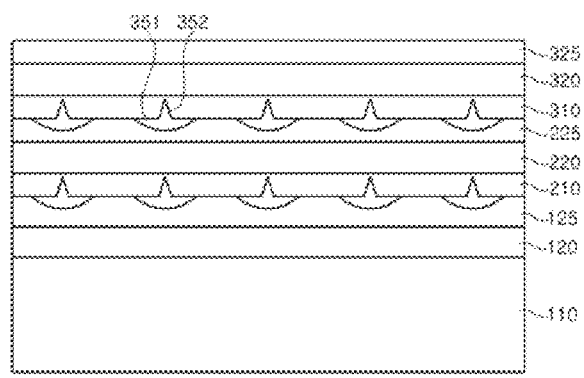

SUBSTRATE REGENERATION METHOD AND REGENERATED SUBSTRATE

CROSS REFERENCE TO RELATED APPLICATION

This application is a continuation application, under 35 USC 120, the PCT Application No. PCT/KR2014/004717 filed on May 27, 2014, published as PCT publication No. WO2014/196759 A1, which further claims priority to Korean Application No. 10-2013-0063578 filed on Jun. 3, 2013. The disclosures of the above referenced applications are incorporated by reference as part of this application.

TECHNICAL FIELD

Exemplary embodiments relate to a method of recycling a substrate and a recycled substrate, and more particularly, to a method of recycling a growth substrate separated from a nitride epitaxial layer and a substrate recycled by the same.

BACKGROUND

A technique for separating a substrate from epitaxial layers is used after growing the epitaxial layers on the substrate. For example, a vertical type gallium nitride-based light emitting diode can be manufactured by growing epitaxial layers including n-type and p-type semiconductor layers on a growth substrate, followed by separating the growth substrate therefrom. A support substrate having higher thermal conductivity than the growth substrate may be attached to the epitaxial layers to improve luminous efficacy.

As such, after the epitaxial layers are grown on the growth substrate, the support substrate independent of the growth substrate is attached to the epitaxial layer by taking operating characteristics into account, and the growth substrate is separated from the epitaxial layers. The growth substrate can be separated from the epitaxial layers using, for example, a laser lift-off process, a chemical lift-off process, or other lift-off processes using thermal stress or mechanical stress. One example of a lift-off technique for separation of the growth substrate is disclosed in Korean Patent Publication No. 10-2012-0094483 A.

SUMMARY

Exemplary embodiments of the disclosed technology provide an improved substrate recycling method, which enables reuse of a substrate separated from epitaxial layers, and a substrate recycled by the same.

Exemplary embodiments of the disclosed technology provide a substrate recycling method, which provides a recycled substrate suitable for growth of epitaxial layers without generating defects such as scratches that obstruct crystal growth on a surface of the recycled substrate, and a substrate recycled by the same.

Exemplary embodiments of the disclosed technology provide a substrate recycling method capable of preventing generation of cracks on a substrate during recycling of the substrate.

Exemplary embodiments provide a substrate recycling method, which provides a recycled substrate suitable for growth of epitaxial layers without damaging a side surface or a rear surface of a separated substrate, and a substrate recycled by the same.

In accordance with one aspect of the disclosed technology, a substrate recycling method is provided to include preparing a substrate having a surface separated from an epitaxial layer such that the separated surface includes a convex portion and a concave portion, the convex portion is flatter than the concave portion, growing a crystallinity restoring layer on the separated surface such that the crystallinity restoring layer is grown on the convex portion, and growing a surface roughness improving layer on the crystallinity restoring layer to have a continuous surface.

Accordingly, it is possible to provide a recycled substrate having a flat surface without removing the surface of the substrate separated from epitaxial layers through physical polishing or chemical etching. Thus, it is possible to provide a recycled substrate suitable for growth of epitaxial layers without generating cracks or scratches on the substrate separated from the previous epitaxial layers. Furthermore, it is possible to provide a recycled substrate having a flat surface without damaging a side surface or a rear surface of the substrate separated from the epitaxial layers.

In some implementations, the crystallinity restoring layer and the surface roughness improving layer may be grown as gallium nitride-based semiconductor layers. Furthermore, the surface roughness improving layer may be grown at a higher temperature and a lower pressure than the crystallinity restoring layer. In some exemplary embodiments, the crystallinity restoring layer may be grown at a temperature of 1000° C. to 1060° C. and a pressure of 300 Torr to 500 Torr in a V/III composition ratio of 200 to 400, and the surface roughness improving layer may be grown at a temperature of 1080° C. to 1140° C. and a pressure of 100 Torr to 200 Torr in a V/III composition ratio of 50 to 250.

In some implementations, the surface separated from the epitaxial layer has poor crystallinity. Accordingly, the surface of the substrate is improved by growing the crystallinity restoring layer. Then, the surface roughness improving layer is grown on the crystallinity restoring layer to provide an epitaxial layer growth plane having relatively good crystallinity.

In some implementations, the crystallinity restoring layer and the surface roughness improving layer may be formed of undoped GaN. As compared with a layer doped with a dopant, the undoped layer may have relatively good crystallinity. However, it should be understood that the crystallinity restoring layer and the surface roughness improving layer are not limited to the undoped layer and at least one of the crystallinity restoring layer and the surface roughness improving layer may be doped with dopants.

In some implementations, the substrate having the surface separated from the epitaxial layer may have a sacrificial layer formed on the surface thereof and having a surface etched by electrochemical etching, the convex portion and the concave portion are formed on the sacrificial layer, and the crystallinity restoring layer may be directly formed on the sacrificial layer.

In some implementations, the substrate having the surface separated from the epitaxial layer may further includes an anti-etching layer at a lower portion of the sacrificial layer to prevent electrochemical etching. In some implementations, the sacrificial layer may include a portion etched by electrochemical etching, and the concave portion may be the portion etched by electrochemical etching. The portion etched by electrochemical etching is formed before separation of the substrate from the epitaxial layer.

In some implementations, the sacrificial layer may include a gallium nitride-based semiconductor layer doped with an n-type dopant, and the anti-etching layer may include an undoped gallium nitride-based semiconductor layer. The anti-etching layer prevents a lower substrate under the anti-etching layer from being etched during electrochemical etching of the sacrificial layer.

In some implementations, the crystallinity restoring layer may be grown in a thickness direction and a lateral direction, the growing in the lateral direction proceeding over an upper portion of the concave portion. The crystallinity restoring layer is grown on a surface of the convex portion instead of being grown on a surface of the concave portion. By lateral growth of the crystallinity restoring layer, a first cavity may be formed on an upper portion of the concave portion and under the crystallinity restoring layer such that the first cavity is surrounded by the surface of the substrate and the crystallinity restoring layer. In some implementations, a second cavity may be formed above the first cavity to be surrounded by the crystallinity restoring layer. In some implementations, the second cavity is disposed in a thickness region of the crystallinity restoring layer.

In some implementations, the convex portion and the concave portion may be regularly arranged, and the convex portion may be formed in a stripe shape, an island shape, or a mesh shape.

In some implementations, the substrate having the surface separated from the epitaxial layer includes a lower substrate disposed under the separated surface. In some implementations, the lower substrate may be a gallium nitride substrate, an aluminum nitride substrate, or a silicon carbide substrate. In some implementations, an expensive substrate such as a gallium nitride substrate, an aluminum nitride substrate and a silicon carbide substrate can be used as a growth substrate, thereby reducing manufacturing costs of a gallium nitride-based semiconductor device.

In accordance with another aspect of the disclosed technology, a recycled substrate includes: a lower substrate; a sacrificial layer disposed on the lower substrate and having a convex portion and a concave portion; a crystallinity restoring layer disposed on the sacrificial layer; and a surface roughness improving layer disposed on the crystallinity restoring layer and having a continuous surface. Accordingly, it is possible to provide a recycled substrate having a surface free from defects such as scratches so that epitaxial layers having good crystal quality can be grown thereon.

In some implementations, the sacrificial layer may include a gallium nitride-based semiconductor layer doped with an n-type dopant. In some implementations, the sacrificial layer may be an n-type GaN layer. In some implementations, the recycled substrate may further include an anti-etching layer disposed between the lower substrate and the sacrificial layer. In some implementations, the anti-etching layer may include a gallium nitride-based semiconductor layer having a lower dopant concentration than the sacrificial layer, for example, an undoped gallium nitride-based semiconductor layer.

In some implementations, the crystallinity restoring layer and the surface roughness improving layer may include an undoped gallium nitride-based semiconductor layer. In some implementations, the crystallinity restoring layer may cover the convex portion and the concave portion of the sacrificial layer to form a first cavity on the concave portion. In some implementations, the crystallinity restoring layer may have a second cavity extending from the first cavity therein.

In some implementations, the recycled substrate may further include a second sacrificial layer disposed on the surface roughness improving layer and having a convex portion and a concave portion; a second crystallinity restor-ing layer disposed on the second sacrificial layer; and a second surface roughness improving layer disposed on the second crystallinity restoring layer and having a continuous surface. In some implementations, the crystallinity restoring layer and the surface roughness improving layer may be repeatedly formed twice or more, so that an initial lower substrate can be reused twice or more.

In some implementations, the second sacrificial layer may include a gallium nitride-based semiconductor layer doped with an n-type dopant like the first sacrificial layer.

According to some implementations, a substrate separated from an epitaxial layer can be reused, thereby reducing manufacturing costs of a semiconductor device such as a light emitting diode. Furthermore, it is possible to provide a recycled substrate suitable for growth of epitaxial layers without generating defects such as scratches that obstruct crystal growth on a surface of the recycled substrate. Further, since physical force is not applied to the substrate in the course of recycling the substrate, it is possible to prevent generation of cracks in the course of recycling the substrate. Further, since the substrate is recycled from the epitaxial layer using a growth technology, there is no need for chemical etching on a surface of the separated substrate, thereby preventing damage to a side surface or a rear surface of the substrate separated from the epitaxial layer.

BRIEF DESCRIPTION OF DRAWINGS

FIG. 6 is graphs depicting a profile of growth temperature and growth pressure for growth of a crystallinity restoring layer and a surface roughness improving layer.

FIG. 7 is sectional views illustrating a method of recycling a substrate separated from an epitaxial layer according to another exemplary embodiment.

DETAILED DESCRIPTION

Figure 1A:
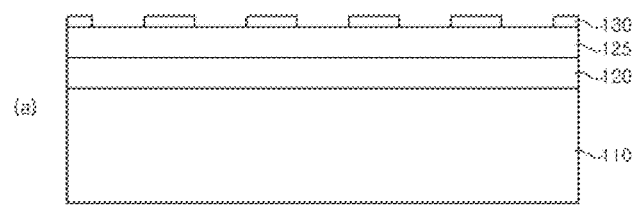
FIGS. 1(a)-1(d) and FIGS. 2(a)-2(c) are sectional views illustrating a method of recycling a substrate separated from an epitaxial layer according to one exemplary embodiment.

In the above described fabrication process, the separated growth substrate can be recycled as a substrate for growth of epitaxial layers, thereby reducing manufacturing costs for substrates. When a typical sapphire substrate is used, there is not so much demand for recycling of the separated substrate as a growth substrate. However, relatively expensive growth substrates, such as a gallium nitride substrate, an aluminum nitride substrate, and a silicon carbide substrate, need to be reused after separation of the substrates due to high price thereof.

On the other hand, most substrates separated from the epitaxial layers tend to have rough surfaces. Thus, there is a need for a substrate recycling technique in order to reuse the separated substrate as a growth substrate for growth of other epitaxial layers. A technique of flattening the surface of the growth substrate separated from the epitaxial layers using chemical mechanical polishing has been studied.

However, the technique using chemical mechanical polishing may scratch the surface of the growth substrate, thereby making it difficult to reuse the growth substrate while causing cracks therein.

In addition, a technique of etching the surface of the growth substrate separated from the epitaxial layers using a chemical process has also been studied. However, chemical etching makes it difficult to achieve flattening of an upper surface of the substrate and damages a side surface or a rear surface thereof.

Hereinafter, exemplary embodiments will be described in detail with reference to the accompanying drawings. The following embodiments are given by way of illustration to provide a thorough understanding of the disclosed technology to those skilled in the art. Accordingly, the disclosed technology is not limited to the embodiments disclosed herein and may also be implemented in different forms. In the drawings, like components will be denoted by like reference numerals, and widths, lengths, and thicknesses of components may be exaggerated for convenience of description.

Exemplary embodiments provide a separated substrate by growing nitride semiconductor layers (epitaxial layers) on a growth substrate, followed by separating the growth substrate from the epitaxial layers. The epitaxial layers separated from the growth substrate may be used in manufacture of a semiconductor device such as a light emitting diode, and the separated substrate may be recycled into a substrate for growth of other epitaxial layers.

Figure 1B:
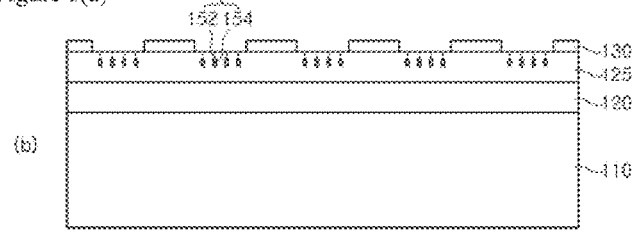
Figure 1C:
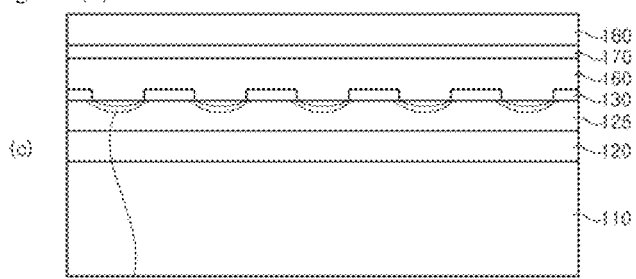
Figure 1D:
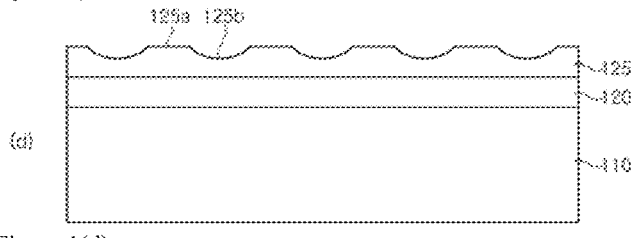
Figure 2A:
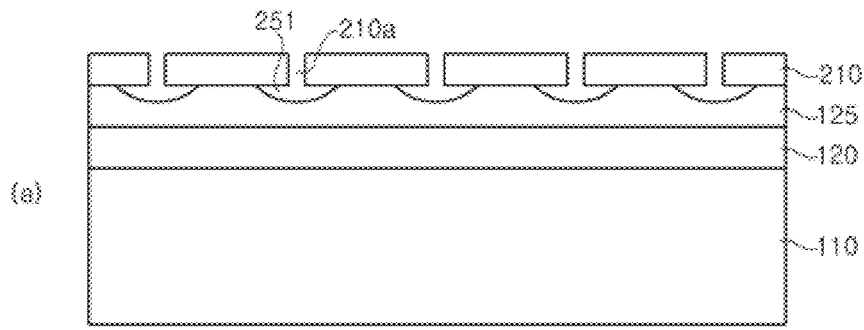
Figure 2B:
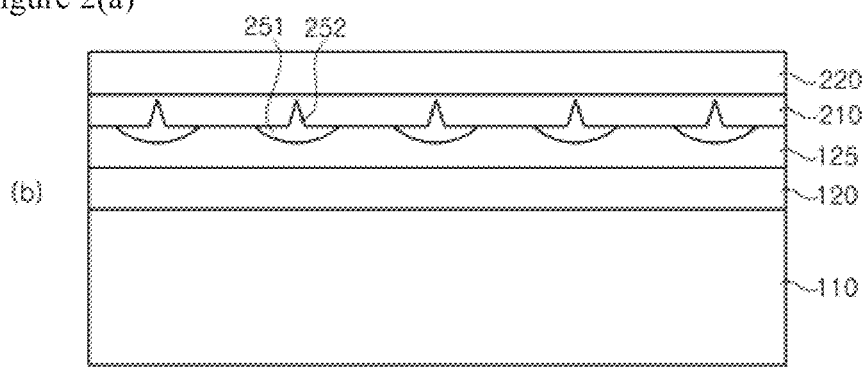

FIG. 1 is sectional views illustrating a process of providing a growth substrate separated from epitaxial layers, and FIG. 2 is sectional views illustrating a process of recycling the separated substrate.

First, referring to FIG. 1(a), an anti-etching layer 120 and a sacrificial layer 125 are grown on a lower substrate 110. As the lower substrate 110, any growth substrate may be used so long as the substrate allows growth of a gallium nitride-based semiconductor layer thereon. Particularly, the lower substrate 110 may be a relatively expensive growth substrate such as a GaN substrate, an AlN substrate or a silicon carbide (SiC) substrate. Further, the lower substrate 110 may include a polar, non-polar or semi-polar substrate.

The anti-etching layer 120 may include an undoped gallium nitride-based semiconductor layer, for example, an undoped GaN layer, and the sacrificial layer 125 may include an n-type gallium nitride-based semiconductor layer doped with an n-type dopant. The anti-etching layer 120 and the sacrificial layer 125 may be grown on the lower substrate 110 by, for example, metal organic chemical vapor deposition (MOCVD).

The anti-etching layer 120 may be grown without doping. Alternatively, the anti-etching layer 125 may be formed of a gallium nitride-based layer, for example, a GaN layer, which is doped with Si in a relatively high doping concentration of, for example, $1E17/cm^3$ to $1E19/cm^3$. Like the anti-etching layer 120 and the sacrificial layer 125, nitride-based semiconductor layers described below may be grown by MOCVD, and further descriptions with respect to this feature will be omitted herein.

Figure 3A:
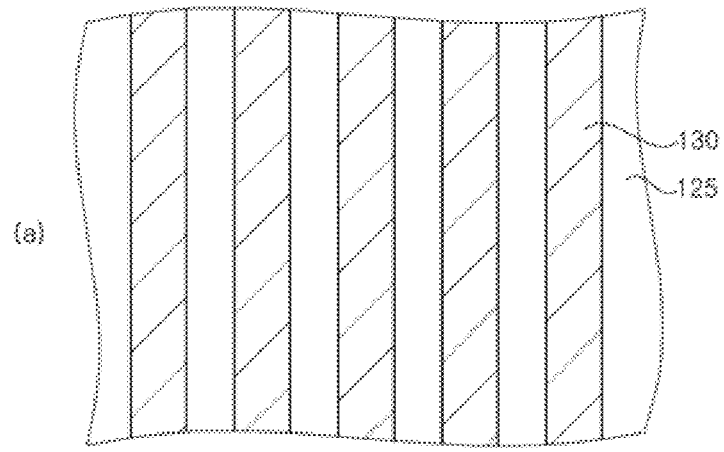
FIG. 3(a) to FIG. 5(b) are plan views illustrating a mask pattern used in separation of a growth substrate.
Figure 3B:
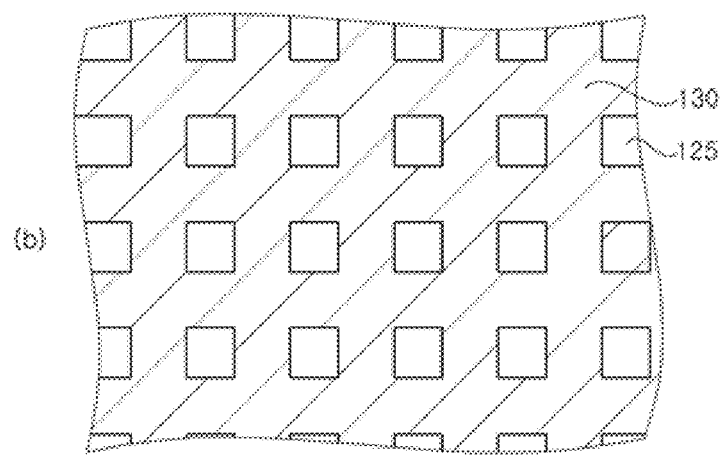
Figure 4A:
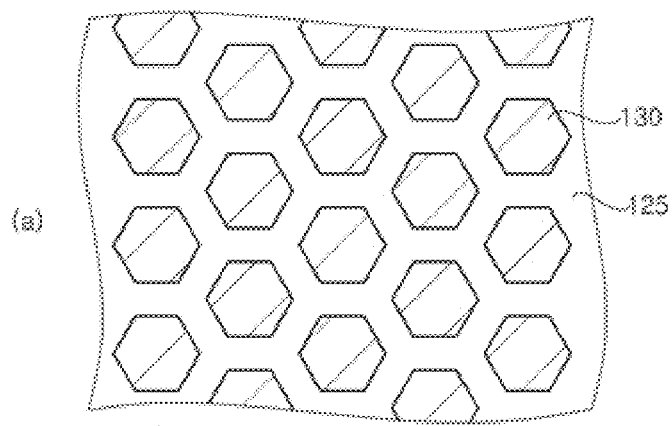
Figure 4B:
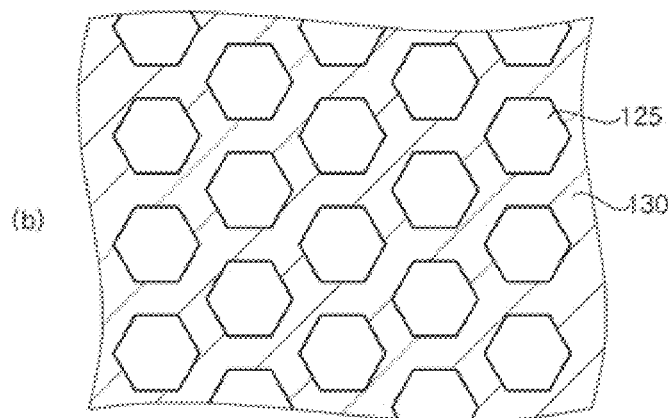
Figure 5A:
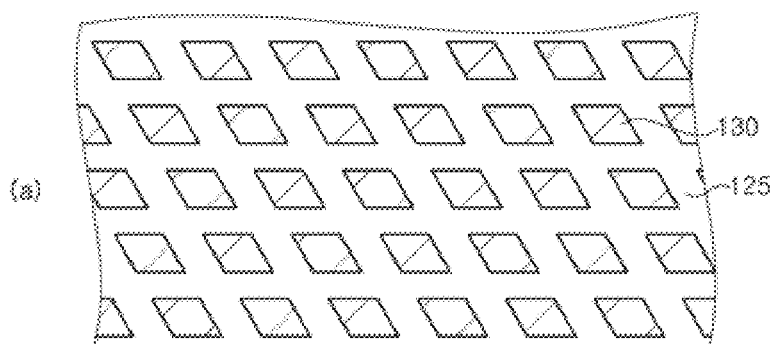
Figure 5B:
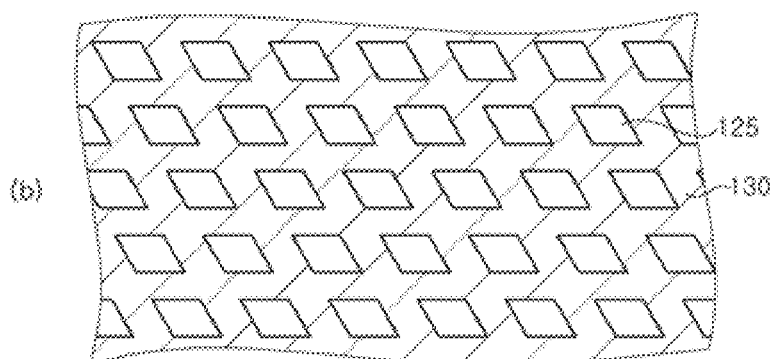
Figure 8A:
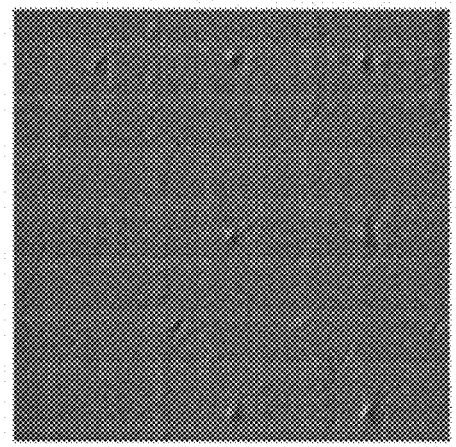
FIG. 8(a) is an image of a surface of a GaN substrate before growth of epitaxial layers.
Figure 8B:
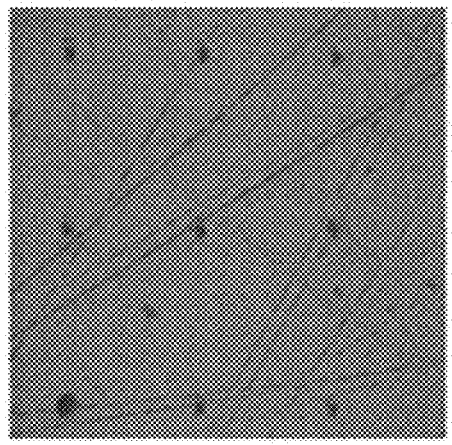
FIG. 8(b) is an image of a surface of a substrate recycled by a general CMP technique.
Figure 8C:
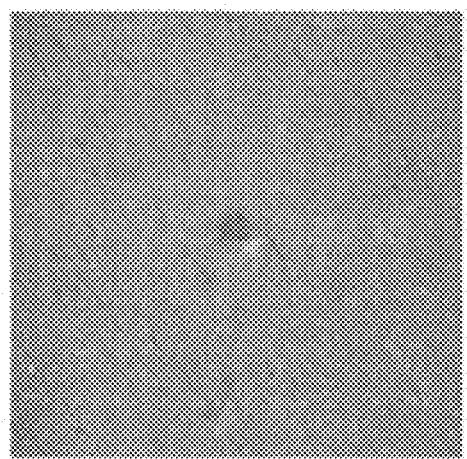
FIG. 8(c) and FIG. 8(d) are images of surfaces of substrates recycled by substrate recycling methods according to exemplary embodiments.
Figure 8D:
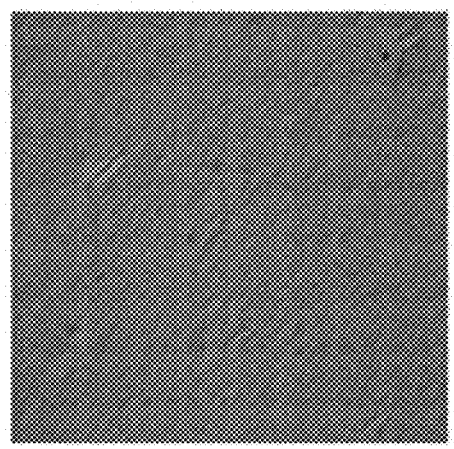

A mask pattern 130 is formed on the sacrificial layer 125. The mask pattern 130 may be formed of, for example, SiN or $SiO_2$, to a thickness of about 5 nm to 10 μm. The mask pattern 130 may have a stripe shape in each mask region, as shown in FIG. 3(a), or may have a cross shape of stripes extending in different directions, as shown in FIG. 3(b). Alternatively, the mask pattern 130 may be a convex pattern, a mask region of which has a hexagonal shape, as shown in FIG. 4(a) or a rhombus shape, as shown in FIG. 5(a). Alternatively, the mask pattern 130 may be a concave pattern, an opening region of which has a hexagonal shape, as shown in FIG. 4(b), or a rhombus shape, as shown in FIG. 5(b). The mask pattern 130 may be a convex pattern, a mask region of which has a circular shape, or may be a concave pattern, an opening region of which has a circular shape. A structure wherein the mask region of the mask pattern 130 has a greater width than a gap between the mask regions, that is, the width of the opening region, is advantageous for growth of a crystallinity restoring layer and a surface roughness improving layer described below. For example, the mask region may have a width of 6 μm to 10 μm and the opening region may have a width of 3 μm to 5 μm.

Referring to FIG. 1(b), the sacrificial layer 125 is partially etched by electrochemical etching (ECE) to form fine pores 150 in the sacrificial layer 125.

In electrochemical etching, with the growth substrate 110 having the sacrificial layer 125 thereon dipped together with a negative electrode (for example, Pt electrode) in an ECE solution, positive voltage is applied to the sacrificial layer 125 and negative voltage is applied to the negative electrode, while regulating the size of the fine pores 150 through adjustment of molar concentration of the ECE solution, process time and application voltage.

The ECE solution may be an electrolyte solution, which includes, for example, oxalic acid, HF or NaOH.

In this exemplary embodiment, the sacrificial layer 125 may be partially etched by a single stage of electrochemical etching (ECE), in which a constant voltage, for example, a voltage in the range of 10V to 60V, is continuously applied, without being limited thereto. Alternatively, the sacrificial layer 125 may be partially etched by two stages of electrochemical etching (ECE), in which a relatively low voltage is applied in an initial stage and a relatively high voltage is then applied. FIG. 1(b) shows fine pores 152, 154 formed by two stages of electrochemical etching, in which the fine pores 152 are formed in a first stage in which a relatively low voltage is applied, and the fine pores 154 having a relatively large size are formed in a second stage in which a relatively high voltage is applied. For example, the sacrificial layer 125 of n-type GaN having a Si doping concentration of $6E18/cm^3$ may be subjected to electrochemical etching in 0.3M oxalic acid solution at 20° C. by applying a voltage of 8V to 9V in the first stage, followed by applying a voltage of 15V to 17V in the second stage.

Through the two stages of electrochemical etching, the surface of the n-type gallium nitride-based semiconductor layer 125 can maintain relatively good crystallinity, and the fine pores 154 having a relatively large size can be formed in the sacrificial layer 125, thereby allowing a subsequent process to be efficiently performed.

Referring to FIG. 1(c), epitaxial layers including a first nitride semiconductor layer 160, an active layer 170 and a second nitride semiconductor layer 180 are grown using the sacrificial layer 125 as seeds. The epitaxial layers cover not only the sacrificial layer 125 but also the mask pattern 130 through lateral growth.

The first nitride semiconductor layer 160 may be a single layer or multiple layers. For example, the first nitride semiconductor layer 160 may be a nitride semiconductor layer doped with a first conductive type dopant, for example, a III-N based compound semiconductor doped with an n-type dopant, such as an (Al, In, Ga)N-based nitride semiconductor layer, and may include a gallium nitride layer. Further, the first nitride semiconductor layer 160 may include an undoped layer which is not doped with dopants.

The active layer 170 may be a III-N based compound semiconductor, for example, an (Al, Ga, In)N semiconductor layer, and may have a single quantum well structure or multi-quantum well structure in which well layers (not shown) and barrier layers (not shown) are alternately stacked one above another.

The second nitride semiconductor layer 180 may include a III-N based compound semiconductor doped with a second conductive type dopant, for example, a p-type dopant, for example, an (Al, Ga, In)N-based Group III nitride semiconductor layer, such as a GaN layer.

On the other hand, during growth of the epitaxial layers 160, 170, 180, the fine pores 152, 154 are combined with each other and grown to form a cavity 150a. The cavity 150a is formed to connect adjacent mask regions of the mask pattern 130 to each other. Although an interface between the sacrificial layer 125 and the first nitride semiconductor layer 160 is shown as remaining in FIG. 1(c), the cavity 150a may constitute the interface between the sacrificial layer 125 and the first nitride semiconductor layer 160.

Referring to FIG. 1(d), the substrate 110 is separated from the epitaxial layers 160, 170, 180. The substrate 110 may be separated from the epitaxial layers 160, 170, 180 by chemical lift-off or stress lift-off.

In one exemplary embodiment, the substrate 110 may be separated from the epitaxial layers 160, 170, 180 by chemical etching in an etchant such as NaOH, BOE or HF. The etchant permeates into a region between the sacrificial layer 125 and the first nitride semiconductor layer 160 through the cavity 150a, and etches the mask pattern 130 or GaN at an interface between the mask pattern 130 and the epitaxial layer 160. As a result, the anti-etching layer 110 and the sacrificial layer 125 are separated together with the lower substrate 110 from the epitaxial layers 160, 170, 180. At this point, the mask pattern 130 may remain on the sacrificial layer 125. The remaining mask pattern 130 is removed by additional wet etching.

In another exemplary embodiment, the substrate 110 may be separated from the epitaxial layers 160, 170, 180 by physical stress instead of using the chemical etchant. Specifically, after formation of the cavity 150a, the sacrificial layer 125 may be separated from the first nitride semiconductor layer 160 by applying stress to the mask pattern 130, and the mask pattern 130 remaining on the sacrificial layer 125 can be removed by wet etching.

The surface of the substrate separated from the epitaxial layers 160, 170, 180 has a convex portion 125a and a concave portion 125b, as shown in FIG. 1(d). The convex portion 125a corresponds to the mask region of the mask pattern 130 and thus has a flatter surface than the concave portion 125b. The arrangement of the convex portion 125a is determined depending upon the shape of the mask pattern 130 described above. Thus, when the mask pattern 130 is formed in a stripe shape, an island shape, or a mesh shape, the convex portion 125a also has a stripe shape, an island shape, or a mesh shape, and the convex portion 125a and the concave portion 125b are regularly arranged.

In this exemplary embodiment, before separation of the substrate 110 from the epitaxial layers 160, 170, 180, a support substrate (not shown) may be formed on the epitaxial layers 160, 170, 180 by a typical process. Further, a semiconductor device such as a light emitting diode can be manufactured using the separated epitaxial layers 160, 170, 180.

Next, a substrate recycling method according to one exemplary embodiment will be described with reference to FIG. 2. In the substrate recycling method according to the exemplary embodiment, the sacrificial layer 125 on the surface of the substrate separated from the epitaxial layers is used instead of being removed by mechanical polishing or chemical etching.

First, referring to FIG. 2(a), a crystallinity restoring layer 210 is grown on the surface of the separated substrate having the convex portion 125a and the concave portion 125b, for example, on the surface of the sacrificial layer 125, as described with reference to FIG. 1(d). Since the sacrificial layer 125 disposed on the surface of the separated substrate has poor crystal quality, it is difficult to directly grow epitaxial layers thereon. Thus, the crystallinity restoring layer 210 is grown thereon to provide a surface having improved crystallinity.

The crystallinity restoring layer 210 may be grown both in a thickness direction and in a lateral direction. As the crystallinity restoring layer 210 is grown in the lateral direction, the crystallinity restoring layer 210 covers an upper region of the concave portion 125b to form a first cavity 251. Here, growth of the crystallinity restoring layer 210 can be completed before combination of the crystallinity restoring layers 210 grown on adjacent convex portions 125a. Accordingly, the crystallinity restoring layer 210 may have openings 210a formed through the crystallinity restoring layer 210 such that the openings 210a communicate with the concave portion 125b.

Then, a surface roughness improving layer 220 is grown on the crystallinity restoring layer 210. As described again below, the surface roughness improving layer 220 is grown at a higher temperature and a lower pressure than the crystallinity restoring layer 210. Thus, lateral growth of the surface roughness improving layer 220 predominantly occurs so that the surface roughness improving layer 220 has a continuous surface and fills the openings 210a in the crystallinity restoring layer 210. As a result, a second cavity 252 is formed in the crystallinity restoring layer 210 to be connected to the first cavity 251. As shown in the drawings, the second cavity 252 has a shape gradually decreasing in width in an upward direction from the first cavity 251.

A good surface is provided by the surface roughness improving layer 220, thereby completing a recycled substrate.

The crystallinity restoring layer 210 and the surface roughness improving layer 220 may be formed without doping in order to improve crystallinity, without being limited thereto.

Figure 2C:
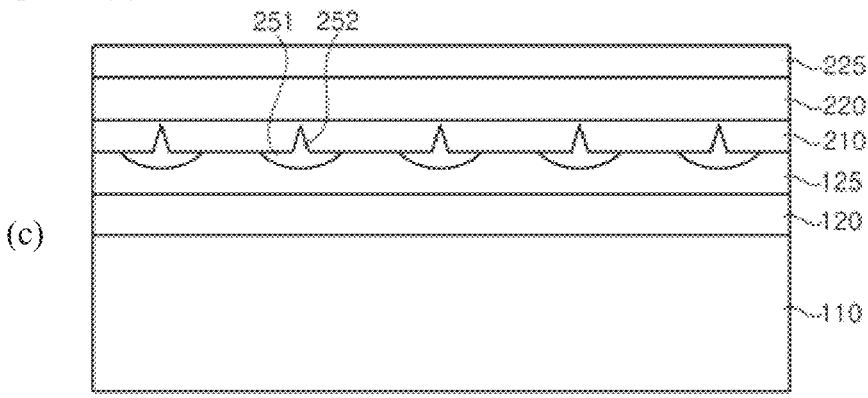

The recycled substrate may be used as a growth substrate for growth of epitaxial layers such as the epitaxial layers 160, 170, 180. FIG. 2(c) shows a structure wherein a second sacrificial layer 225 is formed on the recycled substrate. Like the first sacrificial layer 125, the second sacrificial layer 225 may be a gallium nitride-based semiconductor layer doped with an n-type dopant, for example, an n-type GaN semiconductor layer. When the surface roughness improving layer 220 is an undoped layer, the surface roughness improving layer 220 can act as an anti-etching layer. In other exemplary embodiments, an anti-etching layer may be further formed on the surface roughness improving layer 220 before formation of the second sacrificial layer 225.

Then, a light emitting diode may be manufactured by formation of a mask pattern 130, electrochemical etching, growth of epitaxial layers, and substrate separation again on the second sacrificial layer 225, as described with reference to FIG. 1(a).

FIG. 6 is graphs depicting a profile of growth temperature (a) and growth pressure (b) for growth of the crystallinity restoration layer 210 and the surface roughness improving layer 220.

Referring to FIG. 6(*a*) and FIG. 6(*b*), a substrate separated from epitaxial layers is loaded into a chamber and heated to increase growth temperature to a first temperature T1. The first temperature T1 may range from 1,000° C. to 1,060° C. After the substrate reaches the first temperature T1, a source gas is introduced to the chamber to grow the crystallinity restoration layer 210. At this time, the crystallinity restoring layer is grown at a first pressure P1. The first pressure P1 may range from 300 Torr to 500 Torr and a V/III ratio may range from 200 to 400.

Preferably, the crystallinity restoring layer 210 is grown at a constant temperature T1 and a constant pressure P1, without being limited thereto. The first temperature T1 and the first pressure P1 may vary within these ranges.

After growth of the crystallinity restoring layer 210, the surface roughness improving layer 220 is grown while increasing the growth temperature from the first temperature T1 to a second temperature T2 while decreasing the chamber pressure from the first pressure P1 to a second pressure P2. The second temperature T2 may range from 1080° C. to 1140° C., the second pressure P2 may range from 100 Torr to 200 Torr, and the V/III ratio may range from 50 to 250.

Although the surface roughness improving layer 220 is illustrated as being grown while changing the growth temperature and the growth pressure in this exemplary embodiment, it should be understood that the disclosed technology is not limited thereto and the surface roughness improving layer 220 may be grown at a constant temperature and a constant pressure. Here, the growth conditions of the surface roughness improving layer 220 can be gradually changed by changing the growth temperature and the growth pressure of the surface roughness improving layer 220 from the growth temperature T1 and the growth pressure P1 of the crystallinity restoring layer 210, thereby providing a further improved surface.

Immediately after completion of the growth of the surface roughness improving layer 220, a sacrificial layer 225 may be grown in the same chamber. The sacrificial layer 225 may be grown at a third temperature between the first temperature T1 and the second temperature T2, and at a second pressure P2.

According to this exemplary embodiment, the crystallinity restoring layer 210 and the surface roughness improving layer 220 are adopted, thereby providing a recycled substrate without mechanical polishing or chemical etching of the surface of the substrate separated from the epitaxial layers.

FIG. 7 is sectional views illustrating a method of recycling a substrate separated from an epitaxial layer according to another exemplary embodiment.

Referring to FIG. 7, the substrate recycling method according to this embodiment is different from the substrate recycling method according to the embodiment shown in FIG. 2, wherein the lower substrate 110 is separated from the epitaxial layers 160, 170, 180 and is then recycled after growth of the epitaxial layers 160, 170, 180 on the lower substrate 110, in that epitaxial layers are grown on a substrate recycled once and the substrate is separated from the epitaxial layers and is recycled again.

That is, as described with reference to FIG. 1, formation of a mask pattern, electrochemical etching, and separation of the substrate are repeated on the sacrificial layer 225, as shown in FIG. 2(*c*). As a result, a separated substrate having the sacrificial layer 225 formed on a surface thereof and including a convex portion and a concave portion is provided. Then, a second crystallinity restoring layer 310 and a second surface roughness improving layer 320 are grown on the separated substrate. The second crystallinity restoring layer 310 and the second surface roughness improving layer 320 may be grown under the same growth conditions as the first crystallinity restoring layer 210 and the first surface roughness improving layer 220. Accordingly, a twice recycled substrate is provided and a third sacrificial layer 324 can be formed again on the recycled substrate to repeat the process of growing epitaxial layers.

Although the substrate is illustrated as being recycled twice in this exemplary embodiment, it should be understood that the substrate can be recycled more than twice.

EXPERIMENTAL EXAMPLE

FIG. 8(*a*) is an image of a surface of a GaN substrate before growth of epitaxial layers, (b) is an image of a surface of a substrate recycled by a general CMP technique, and (c) and (d) are images of surfaces of substrates recycled by substrate recycling methods according to exemplary embodiments.

FIG. 8(*b*) is an image of the surface of the substrate after removing the sacrificial layer 125 using a CMP technique, and it can be seen that many scratches were formed on the surface of the substrate, as compared with the GaN substrate before growth of epitaxial layers. The scratches will provide adverse effects on crystal quality of the epitaxial layers to be grown on the substrate.

FIG. 8(*c*) and FIG. 8(*d*) show the surface of the recycled substrate after directly growing the crystallinity restoring layer 210 and the surface roughness improving layer 220 on the sacrificial layer 125 of the substrate separated from the epitaxial layers. In FIG. 8(*c*) and FIG. 8(*d*), the crystallinity restoring layer 210 and the surface roughness improving layer 220 were grown under the same conditions excluding a growth time of the surface roughness improving layer. Here, the growth time of the surface roughness improving layer in FIG. 8(*d*) was three times that of the surface roughness improving layer in FIG. 8(*c*).

Both substrates shown in FIG. 8(*c*) and FIG. 8(*d*) have better surfaces than the substrate recycled using CMP. Further, it can be seen that the surface of the substrate became better when the thickness of the surface roughness improving layer was increased while increasing the growth time thereof.

Although some exemplary embodiments are disclosed herein, it should be understood that these embodiments are not intended to be exclusive. For example, individual structures, elements or features of a particular embodiment are not limited to that particular embodiment and can be applied to other embodiments.

The invention claimed is:

1. A substrate recycling method comprising:
preparing a substrate having a surface separated from an epitaxial layer such that the separated surface comprises a convex portion and a concave portion, the convex portion being flatter than the concave portion;
growing a crystallinity restoring layer on the separated surface such that the crystallinity restoring layer is grown on the convex portion and forms a first cavity on an upper portion of the concave portion; and
growing a surface roughness improving layer on the crystallinity restoring layer to have a continuous surface, wherein the preparing of the substrate includes performing two stages of electrochemical etching (ECE) with different voltages from each other to form a sacrificial layer.

2. The substrate recycling method according to claim 1, wherein the crystallinity restoring layer and the surface roughness improving layer are grown as gallium nitride-based semiconductor layers, and the surface roughness improving layer is grown at a higher temperature and a lower pressure than the crystallinity restoring layer.

3. The substrate recycling method according to claim 2, wherein the crystallinity restoring layer is grown at a temperature of 1000° C. to 1060° C. and a pressure of 300 Torr to 500 Torr in a V/III composition ratio of 200 to 400, and the surface roughness improving layer is grown at a temperature of 1080° C. to 1140° C. and a pressure of 100 Torr to 200 Torr in a V/III composition ratio of 50 to 250.

4. The substrate recycling method according to claim 3, wherein the crystallinity restoring layer and the surface roughness improving layer are formed of undoped GaN.

5. The substrate recycling method according to claim 1, wherein the sacrificial layer is formed on the surface of the substrate, the convex portion and the concave portion are formed on the sacrificial layer, and the crystallinity restoring layer is directly formed on the sacrificial layer.

6. The substrate recycling method according to claim 5, wherein the substrate having the surface separated from the epitaxial layer further comprises an anti-etching layer at a lower portion of the sacrificial layer to prevent electrochemical etching.

7. The substrate recycling method according to claim 6, wherein the sacrificial layer comprises a gallium nitride-based semiconductor layer doped with an n-type dopant, and the anti-etching layer comprises an undoped gallium nitride-based semiconductor layer.

8. The substrate recycling method according to claim 1, wherein the crystallinity restoring layer is grown in a thickness direction and a lateral direction, the growing in the lateral direction proceeding over an upper portion of the concave portion.

9. The substrate recycling method according to claim 8, wherein the first cavity is formed on an upper portion of the concave portion and under the crystallinity restoring layer such that the first cavity is surrounded by the surface of the substrate and the crystallinity restoring layer.

10. The substrate recycling method according to claim 9, wherein a second cavity is formed above the first cavity to be surrounded by the crystallinity restoring layer.

11. The substrate recycling method according to claim 1, wherein the convex portion is formed in a stripe shape, an island shape, or a mesh shape.

12. The substrate recycling method according to claim 1, wherein the substrate having the surface separated from the epitaxial layer comprises a lower substrate disposed under the separated surface, and the lower substrate is a gallium nitride substrate.

13. A recycled substrate comprising:
a lower substrate;
a sacrificial layer disposed on the lower substrate and having a first horizontal surface near the lower substrate and a second surface away from the lower substrate, and wherein the second surface includes a convex portion and a concave curved portion;
a crystallinity restoring layer disposed on the sacrificial layer; and
a surface roughness improving layer disposed on the crystallinity restoring layer and having a continuous surface;
wherein the crystallinity restoring layer covers the convex portion and the concave portion of the sacrificial layer to form a first cavity on the concave portion; and
wherein the crystallinity restoring layer has a second cavity extending from, and less than entirety of, the first cavity therein.

14. The recycled substrate according to claim 13, wherein the sacrificial layer comprises a gallium nitride-based semiconductor layer doped with an n-type dopant.

15. The recycled substrate according to claim 14, further comprising: an anti-etching layer disposed between the lower substrate and the sacrificial layer.

16. The recycled substrate according to claim 15, wherein the anti-etching layer comprises an undoped gallium nitride-based semiconductor layer.

17. The recycled substrate according to claim 13, wherein the crystallinity restoring layer and the surface roughness improving layer are undoped gallium nitride-based semiconductor layers.

18. The recycled substrate according to claim 13, further comprising:
a second sacrificial layer disposed on the surface roughness improving layer and having a convex portion and a concave portion;
a second crystallinity restoring layer disposed on the second sacrificial layer; and
a second surface roughness improving layer disposed on the second crystallinity restoring layer and having a continuous surface.

19. The recycled substrate according to claim 18, wherein the second sacrificial layer comprises a gallium nitride-based semiconductor layer doped with an n-type dopant.

20. The method of claim 13, wherein the crystallinity restoring layer is positioned between the sacrificial layer and the surface roughness improving layer.

* * * * *